United States Patent [19]

Scornavacca et al.

[11] 4,303,467
[45] Dec. 1, 1981

[54] PROCESS AND GAS FOR TREATMENT OF SEMICONDUCTOR DEVICES

[75] Inventors: Frank Scornavacca, Emerson, N.J.; Richard L. Bersin, Castro Valley, Calif.

[73] Assignee: Branson International Plasma Corporation, Hayward, Calif.

[21] Appl. No.: 850,713

[22] Filed: Nov. 11, 1977

[51] Int. Cl.$^3$ .................... C23F 1/02; H01L 21/306; C03C 15/00; C03C 25/06
[52] U.S. Cl. .................................. 156/643; 156/345; 156/646; 156/656; 156/657; 204/192 E; 252/79.1
[58] Field of Search .................. 204/164, 168–170, 204/192 E, 192 EC, 298; 156/643, 646, 656, 657, 659, 662, 664, 345, 653; 427/39; 252/79.1, 79.2, 79.3

[56] References Cited

U.S. PATENT DOCUMENTS 4,026,742  5/1977  Fujino .................................. 156/643
4,213,818  7/1980  Lemons et al. .................. 156/653 X

FOREIGN PATENT DOCUMENTS 46-35574  10/1971  Japan .................................. 156/646

Primary Examiner—William A. Powell
Attorney, Agent, or Firm—Flehr, Hohbach, Test, Albritton & Herbert

[57] ABSTRACT

Gas plasma process and gas mixture useful for the removal of materials in the manufacture of semiconductor devices. Substrate wafers or other semiconductor devices are exposed to a gaseous plasma containing $SiF_4$ or $SiF_4$ and oxygen for a time sufficient to effect a desired removal of material from the wafer or device. The process and gas are particularly suitable for selective etching of $Si_3N_4$ and the stripping of photoresist, as well as the etching of materials such as silicon and compounds containing silicon.

17 Claims, 2 Drawing Figures

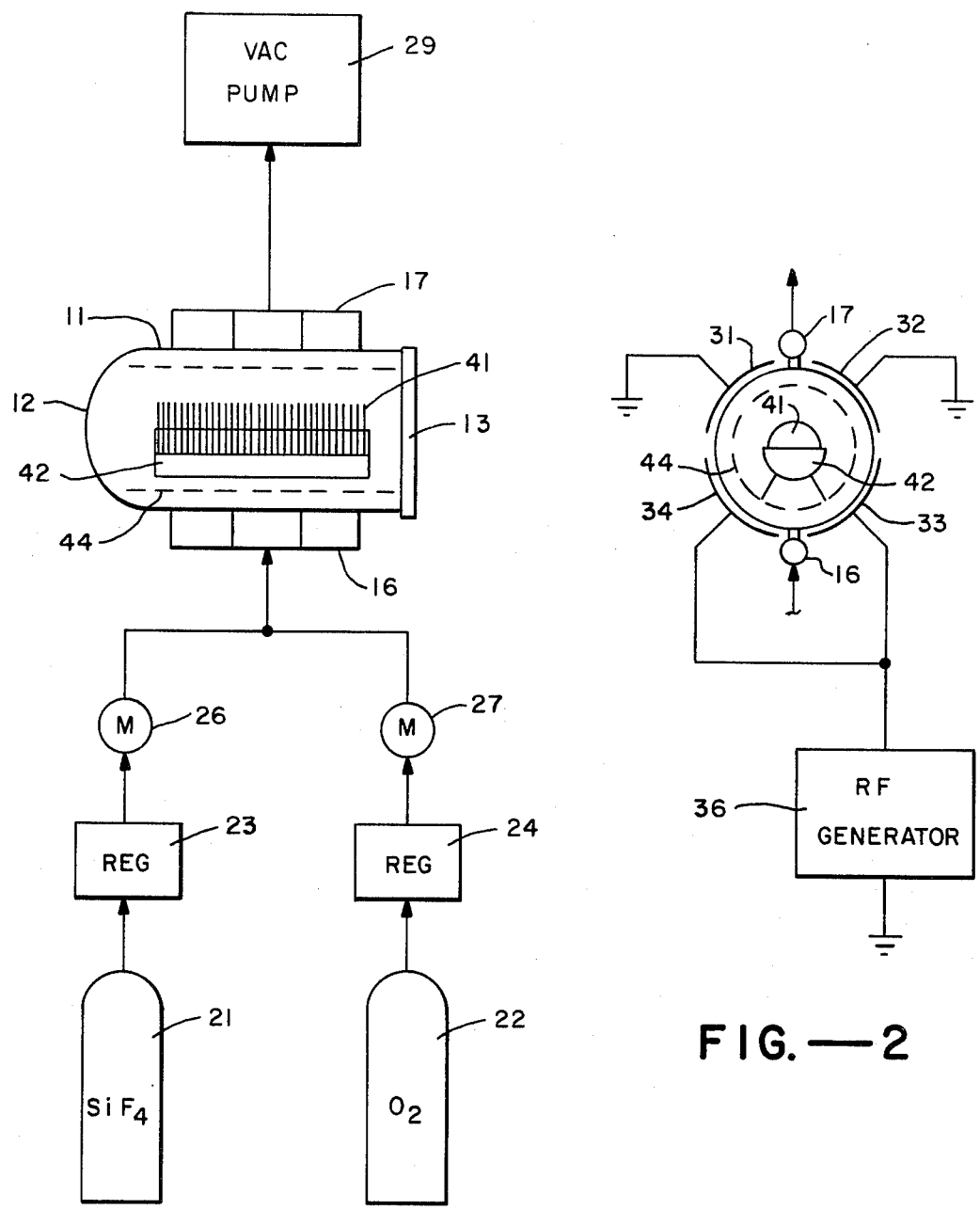

PROCESS AND GAS FOR TREATMENT OF SEMICONDUCTOR DEVICES

BACKGROUND OF THE INVENTION

This invention pertains generally to gas plasma processes and materials and more particularly to a process and gas useful for the removal of materials in the manufacture of semiconductor devices in a plasma environment.

In the treatment of semiconductor devices in a gas plasma environment, the wafers or devices to be treated are commonly placed in a reactor chamber in which a reactant gas is excited with RF energy to form a gaseous plasma to which the wafers or devices are exposed to effect the desired treatment, e.g., etching of a metallization layer, etching of a passivation or diffusion barrier, or stripping of photoresist.

Heretofore, halocarbons such as $CF_4$ have been utilized in the plasma treatment of semiconductor devices, and one process utilizing a mixture of a halocarbon and oxygen is disclosed in U.S. Pat. No. 3,795,557, dated Mar. 5, 1974. One of the by-products of such reactions is silicon tetrafluoride ($SiF_4$) which, prior to the invention disclosed herein, was not thought to be of any utility in the processing of semiconductor wafers or other devices containing silicon.

SUMMARY AND OBJECTS OF THE INVENTION

Surprisingly, however, it has been found that $SiF_4$ and mixtures of $SiF_4$ and oxygen are quite useful in the plasma treatment of semiconductor devices. The use of a gas consisting essentially of $SiF_4$ has been found to provide a significant improvement in the selective etching of passivation and diffusion barrier materials such as $Si_3N_4$. It has also been discovered that mixtures of $SiF_4$ and oxygen containing from about 2 to about 20% oxygen (v/v) are as effective as mixtures of $CF_4$ and oxygen in the etching of silicon and other materials containing silicon. In addition, mixtures of $SiF_4$ and oxygen containing from about 50 to 95% oxygen (v/v) have been found to give excellent results in the stripping of photoresists materials.

It is in general an object of the invention to provide a new and improved process and gas for use in the treatment of semiconductor devices.

Another object of the invention is to provide a process and gas of the above character which are particularly useful in the selective etching of passivation and diffusion barrier materials such as $Si_3N_4$.

Another object of the invention is to provide a process and gas of the above character which are particularly useful in the etching of silicon and materials containing silicon.

Another object of the invention is to provide a process and gas of the above character which are useful in the stripping of photoresist.

Additional objects and features of the invention will be apparent from the following disclosure in which the preferred embodiments are set forth in detail in conjunction with the accompanying drawings.

BRIEF DESCRIPTION OF THE DRAWINGS

FIG. 1 is a diagrammatic illustration of plasma etching apparatus of a type useful in the process of the invention.

FIG. 2 is a diagrammatic cross-sectional view of the reactor chamber of the apparatus of FIG. 1.

DESCRIPTION OF THE PREFERRED EMBODIMENTS

As illustrated, the plasma etching apparatus includes a generally cylindrical reactor chamber 11 fabricated of a suitable material such as quartz, with a generally hemispherical rear wall 12 and a generally planar front door 13. An inlet manifold 16 is provided toward the bottom of the chamber and an exhaust manifold 17 is provided toward the top. Gas is supplied to the reactor chamber through the inlet manifold from a pressurized source 21 of $SiF_4$ and a pressurized source 22 of oxygen. The flow from the respective sources, and therein the relative proportions of the gases in the mixture supplied to the chamber, is controlled by flow regulators 23, 24 and monitored by flow meters 26, 27. Gas is removed from the chamber by an exhaust pump 29 connected to the exhaust manifold.

Means is provided for energizing the gas within the chamber to ionize the gas and thereby form the desired plasma. This means includes generally semicylindrical electrodes 31-34 which are positioned coaxially about the chamber and connected together electrically in upper and lower pairs. As illustrated, upper electrodes 31, 32 are grounded, and lower electrodes 33, 34 are connected to the output of an RF generator 36 which typically operates at a frequency on the order of 13.56 MHz.

The wafers 41 to be treated are supported by a suitable boat or rack 42 which, in the embodiment illustrated, is disposed within a perforated cylinder 44 of electrically conductive material such as aluminum. The perforated cylinder serves to confine the glow discharge of the plasma to the region between the cylinder and the reactor wall and, in some applications, results in faster and more uniform etching of the materials to be removed. A suitable reaction apparatus is available from International Plasma Corporation, Hayward, Calif.

According to the general process of the invention, the wafers are loaded into boat 42, and the loaded boat is placed in chamber 11. Door 13 is moved into position, and pump 29 is actuated to reduce the pressure in the chamber. Gas is admitted to the chamber in the desired mixture from sources 21 and 22, and electrodes 31-34 are energized to ionize the gas. The gas mixture flows continuously through the chamber at a rate on the order of 100-500 cc./min., and a working pressure on the order of 0.25-5 Torr is maintained in the chamber. The temperature in the chamber during the reaction is typically on the order of 20°-150° C.

Although in the drawing, two separate gas tanks 21, 22 are shown each with its own separate regulator, it is to be understood that a single tank containing a performed mixture of $SiF_4$ and oxygen can be used in those instances in which the process employs a gas mixture.

Tables 1-3 illustrate the etch rates (Angstroms/minute) obtained with different gas mixtures and different materials processed in accordance with the invention. These results were obtained by carrying out the general process described in a reactor chamber having a diameter of 8 inches and a length of 18 inches, with an RF power of 350 watts applied to the electrodes.

TABLE 1

| Material Etched | SiF$_4$ Etch Rate (A/Min.) |
|---|---|
| Si$_3$N$_4$ | 175 |
| SiO$_2$ | 0 |
| CVD | 0 |
| Si | 0 |
| PSG | 0 |

P = 0.4 Torr

From the data of Table 1, it will be apparent that a plasma gas consisting essentially of SiF$_4$ with no oxygen, is highly effective and selective etchant for Si$_3$N$_4$. The use of SiF$_4$ in the general process described above, (flow rate=150 cc/min.; P=0.4 Torr) resulted in the removal of Si$_3$N$_4$ from substrate wafers at the rate of 175° A/min. with no appreciable etching of the underlying silicon or silicon containing compounds. This is an unexpected and significant result in that, for the first time known to applicants, it is now possible to etch Si$_3$N$_4$ deposited in thin layers over silicon or SiO$_2$ in a plasma process without damage to the underlying substrate. Another important advantage of this process is that photoresist materials such as Shipley AZ1350, Kodak KTFR, Hunt Waycoat IC, and OMR 83 are not appreciable affected by the plasma, even when cylinder 44 is not employed.

TABLE 2

SiF$_4$ + Oxygen
(Without Perforated Al Cylinder)

| Oxygen | Si | POLY | CVD | SiO$_2$ | PSG | Si$_3$N$_4$ | Mo | Ti |
|---|---|---|---|---|---|---|---|---|
| 0% | 0* | 10 | 0 | 0 | 0 | 35 | 132 | 400 |
| 2% | 1000 | 480 | 60 | 30 | 170 | 400 | — | — |
| 4% | 1200 | — | 90 | 50 | 230 | 400 | 1160 | 570 |
| 6% | — | — | — | — | — | 400 | — | — |
| 8% | — | 510 | 120 | 75 | 310 | 400 | — | — |
| 20% | — | 180 | — | — | — | — | — | — |

*Etch Rate (A/Min)
P = 1.0 Torr

The data of Tables 2 and 3 show that a mixture of SiF$_4$ and about 2-20% oxygen (v/v) is an effective etchant for materials such as single crystal silicon (Si) polycrystalline silicon (POLY), chemical vapor deposited silicon (CVD), SiO$_2$, phospho silicate glass (PSG), molybedenum (Mo) and titanium (Ti). The data in these two tables was obtained under identical condition using the described general process (gas flow rate=750 cc/min.; P=1.0 Torr), except that cylinder 44 was utilized only in connection with the data of Table 3. It should also be noted with regard to Tables 2 and 3 that polycrystalline silicon enters more slowly than single crystal silicon, which is opposite to what is observed with CF$_4$ plasmas. This is important because it indicates that controlled etching of polycrystalline silicon is possible with the gas mixture of the invention.

TABLE 3

SiF$_4$ = Oxygen
(With Perforated Al Cylinder)

| Oxygen | Si | POLY | CVD | SiO$_2$ | PSG | Si$_3$N$_4$ | Mo | Ti |
|---|---|---|---|---|---|---|---|---|
| 0% | 0* | 0 | 0 | 0 | 0 | 10 | — | — |
| 2% | 500 | 460 | 0 | 10 | 0 | 150 | — | — |
| 4% | 1250 | 470 | 45 | 30 | 10 | 150 | 240 | 200 |
| 6% | 1100 | — | — | 30 | 200 | 200 | — | — |
| 8% | 870 | 440 | 75 | 40 | 190 | 250 | — | — |
| 20% | — | — | 100 | 30 | — | 250 | — | — |

*Etch Rate (A/Min)
P = 1.0 Torr

Table 4 contains the results obtained using gas mixtures containing about 5 to 50% SiF$_4$ and about 95 to 50% oxygen (v/v) in the described apparatus (flow rate=750 cc/min.) to strip photoresist materials such as Shipley AZ1350, Kodak KTFR, Hunt Waycoat IC, and OMR 83. The data of Table 4 shows that mixtures of SiF$_4$ and oxygen with relatively high oxygen concentrations are surprisingly effective in the stripping of photoresist, even inside the perforated aluminum cylinder. Stripping inside such a cylinder has always been difficult, and with the process and gas mixture of the invention, it is no longer necessary to open the chamber and remove the perforated cylinder between etching and stripping operations.

TABLE 4

Photoresist Stripping
(SiF$_4$/O$_2$ Mixture in Perforated Al Cylinder)

| SiF$_4$(%) | P = 1.0 Torr | P = 2.0 Torr |
|---|---|---|
| 5 | 11.0* | 10.1 |
| 10 | 6.5 | 6.7 |
| 20 | 4.0 | 5.6 |
| 30 | 3.0 | 4.6 |
| 40 | 2.6 | 3.9 |
| 50 | 2.2 | 3.4 |

*Stripping time (Minutes for a layer of negative photoresist approximately one micron thick.

The SiF$_4$ gas preferred for use in the selective etching of the passivation and diffusion barrier of Si$_3$N$_4$ is pure technical grade SiF$_4$ such as that available from Matheson of Lyndhurst, N.J. However, other gas mixtures "consisting essentially of" SiF$_4$ and gases which do not interfere with or adversely effect the selective etching of the Si$_3$N$_4$ under the process conditions may also be employed. The gas mixture contemplated for use in the invention may be either binary mixtures of SiF$_4$ and oxygen, mixtures of SiF$_4$ oxygen and other active gases such as CF$_4$, or mixtures "consisting essentially" of SiF$_4$ and oxygen, i.e., mixtures which contain other gases which do not interfere with or adversely effect the process results. Although generally the mixtures containing the previously recited concentrations of SiF$_4$ and oxygen are preferred, there may be instances in which mixtures containing concentrations of the ingredients outside of the preferred ranges may be employed to advantage.

It is to be understood that although for purposes of illustration an apparatus has been described which permits the use of SiF$_4$ to remove a passivation and diffusion barrier material and the subsequent use of gas mixtures containing the SiF$_4$ and oxygen to remove other materials, the pactice of the process of the invention is not to be so limited. For example, if desired, SiF$_4$ can be used to selectively etch a passivation and diffusion barrier, material such as Si$_3$N$_4$ and then the photoresist layer and/or undesirable silicon materials can be removed by use of other gas mixtures, e.g., CF$_4$ and oxygen.

The invention has a number of important features and advantages. It provides a process and gas mixture which are surprisingly effective in the selective etching of $Si_3N_4$, the stripping of photoresist, and the etching of materials such as silicon and silicon containing compounds.

It is apparent from the foregoing that a new and improved process and gas for use in the manufacture of semiconductor devices have been provided. While only the presently preferred embodiments have been described in detail, as will be apparent to those familiar with the art, certain changes and modifications can be made without departing from the scope of the invention as defined by the following claims.

What is claimed is:

1. In a process for removing a material from a semiconductor device in a plasma reactor, the steps of: introducing $SiF_4$ and oxygen gas into the reactor chamber, energizing the $SiF_4$ and oxygen gas to form a plasma, and exposing the material to the plasma for a time sufficient to remove a predetermined amount of the material.

2. The process of claim 1 wherein the material to be removed is photoresist and the gas contains on the order of 10 to 50 percent $SiF_4$ by volume.

3. In a process for removing a material consisting of or containing silicon from a semiconductor device in a plasma environment, the step of exposing the material to a gaseous plasma containing $SiF_4$ as a major constituent thereof for a time sufficient to remove a predetermined amount of the material.

4. In an etching process for selectively removing $Si_3N_4$ from a semiconductor device in a plasma environment, the step of exposing the device to a gaseous plasma containing $SiF_4$ and no oxygen for a time sufficient to remove the $Si_3N_4$.

5. In a process for removing photoresist from a semiconductor structure in a plasma environment, the step of exposing the photoresist to a gaseous plasma formed of a mixture of $SiF_4$ and at least 20 percent oxygen by volume for a time sufficient to remove the photoresist.

6. A gas for removing silicon or a silicon containing material from a semiconductor device in a plasma environment, comprising a mixture of $SiF_4$ and oxygen.

7. The gas of claim 6 wherein the mixture contains on the order of 2 to 20 percent oxygen by volume.

8. A gas for removing photoresist from a semiconductor structure in a plasma environment, comprising a mixture of $SiF_4$ and oxygen.

9. The gas of claim 8 wherein the mixture contains at least 50 percent oxygen by volume.

10. A plasm etching process for selectively removing a passivation and diffusion barrier material from a substrate comprising the steps of placing said substrate in a plasma environment, and exposing the substrate to a gas plasma consisting essentially of $SiF_4$ for a period of time sufficient to remove the desired amount of barrier material from the substrate.

11. A plasma etching process for etching a material selected from a silicon containing material, molybedenum and titanium, which process comprises placing the material in a plasma environment and then exposing the material to a gas plasma containing $SiF_4$ and oxygen for a sufficient period of time to obtain the desired etching of the material.

12. The process of claim 11 wherein the mixture contains about 2 to about 20% oxygen by volume.

13. A process for stripping a photoresist material from a semiconductor device which comprises placing said device in a plasma environment and exposing the device to a gas plasma mixture containing oxygen and at least 5% $SiF_4$ for a sufficient period of time to strip the desired amount of the photoresist material.

14. A composition useful as a gas plasma in a plasma etching process which consists of a mixture comprised of $SiF_4$ and oxygen.

15. The composition of claim 14 wherein the mixture contains about 2 to about 20% oxygen by volume.

16. The composition of claim 14 wherein the mixture contains at least 5% $SiF_4$ volume.

17. A gas mixture useful in a plasma etching process, which mixture consists essentially of $SiF_4$ and oxygen.

* * * * *